(12) United States Patent
Park et al.

(10) Patent No.: US 11,910,692 B2
(45) Date of Patent: Feb. 20, 2024

(54) DISPLAY DEVICE INCLUDING TEST ELEMENT GROUP, AND METHOD FOR INSPECTING DEFECT OF DISPLAY DEVICE

(71) Applicant: Samsung Display Co., Ltd., Yongin-Si (KR)

(72) Inventors: Seunghyun Park, Seoul (KR); Yun-Mo Chung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 261 days.

(21) Appl. No.: 17/462,705

(22) Filed: Aug. 31, 2021

(65) Prior Publication Data

US 2022/0173172 A1 Jun. 2, 2022

(30) Foreign Application Priority Data

Nov. 27, 2020 (KR) .......................... 10-2020-0162198

(51) Int. Cl.
*H10K 59/88* (2023.01)
*G01R 31/28* (2006.01)
*H10K 50/822* (2023.01)
*H10K 71/00* (2023.01)
*H10K 50/828* (2023.01)
*H10K 59/12* (2023.01)

(52) U.S. Cl.
CPC ......... *H10K 59/88* (2023.02); *G01R 31/2884* (2013.01); *H10K 50/822* (2023.02); *H10K 71/00* (2023.02); *H10K 50/828* (2023.02); *H10K 59/12* (2023.02); *H10K 59/1201* (2023.02)

(58) Field of Classification Search
CPC .... H10K 50/822; H10K 50/828; H10K 59/12; H10K 59/1201; H10K 59/131; H10K 59/88; G01R 31/2884
USPC ........................................................... 257/48
See application file for complete search history.

(56) References Cited

U.S. PATENT DOCUMENTS

2016/0365399 A1* 12/2016 Sato ................... H10K 59/1213
2020/0203236 A1* 6/2020 Lee ..................... G01R 31/2884
2021/0384224 A1* 12/2021 Tian ..................... H01L 27/1262
(Continued)

FOREIGN PATENT DOCUMENTS

KR 1020050088416 A 9/2005
KR 1020060082096 A 7/2006
(Continued)

*Primary Examiner* — Matthew E. Gordon
(74) *Attorney, Agent, or Firm* — CANTOR COLBURN LLP

(57) ABSTRACT

A display device includes a substrate including a display area and a test area adjacent to the display area, a lower electrode disposed in the display area on the substrate, a common layer disposed on the lower electrode, an upper electrode disposed on the common layer; and a test element group. The test element group includes a plurality of electrode patterns disposed in a same layer as the lower electrode and in the test area on the substrate, a test common layer disposed in a same layer as the common layer and on the electrode patterns, where a plurality of openings is defined through the test common layer to expose a part of each of the electrode patterns, and an electrode layer disposed in a same layer as the upper electrode, on the test common layer, and in contact with the electrode patterns through the openings.

13 Claims, 10 Drawing Sheets

(56) References Cited

U.S. PATENT DOCUMENTS

| | | | |
|---|---|---|---|
| 2022/0005910 A1* | 1/2022 | Ming | G09F 9/301 |
| 2022/0123073 A1* | 4/2022 | Li | H10K 59/122 |
| 2022/0190088 A1* | 6/2022 | Han | H01L 25/167 |

FOREIGN PATENT DOCUMENTS

| | | |
|---|---|---|
| KR | 1020150096336 A | 8/2015 |
| KR | 102090159 B1 | 3/2020 |

* cited by examiner

DISPLAY DEVICE INCLUDING TEST ELEMENT GROUP, AND METHOD FOR INSPECTING DEFECT OF DISPLAY DEVICE

This application claims priority to Korean Patent Application No. 10-2020-0162198, filed on Nov. 27, 2020, and all the benefits accruing therefrom under 35 U.S.C. § 119, the content of which in its entirety is herein incorporated by reference.

BACKGROUND

1. Field

Embodiments relate generally to a display device and a method for inspecting defect of the display device. More particularly, embodiments of the disclosure relate to a display device including a test element group and a method for inspecting defect of the display device.

2. Description of the Related Art

Recently, a flat panel display ("FPD"), which typically has a large area and is thin and lightweight, has been widely used as a display device. As such a flat panel display, a liquid crystal display ("LCD"), a plasma display panel ("PDP"), an organic light emitting display ("OLED"), and the like are used.

The OLED may be manufactured in a top emission structure or a bottom emission structure. In a case where the OLED has the top emission structure, since a light emitted from an organic emission layer passes through a cathode electrode, which is an upper electrode, the cathode electrode is desired to be transparent. Accordingly, a transparent material may be deposited thinly to make the cathode electrode transparent. As a thickness of the cathode electrode decreases, transmittance increases, but resistance may also increase.

SUMMARY

In a case of a large display device, an area of the cathode electrode is larger than an area of the cathode electrode of a small display device, and thus resistance may be substantially increased. In this case, by forming an auxiliary line connected to the cathode electrode, the resistance may be lowered while reducing the thickness of the cathode electrode. In this case, a laser drilling process may be performed to connect the auxiliary line and the cathode electrode.

Conventionally, a microscope has been used to check whether an opening for connecting the auxiliary line and the cathode electrode is properly formed. However, this method has been difficult to accurately inspect the defect of the display device.

Embodiments provide a display device including a test element group.

Embodiments provide a method for inspecting defect of the display device.

According to an embodiment of the invention, a display device includes a substrate including a display area and a test area adjacent to the display area, a lower electrode disposed in the display area on the substrate, a common layer disposed on the lower electrode, an upper electrode disposed on the common layer, and a test element group. In such an embodiment, the test element group includes a plurality of electrode patterns disposed in a same layer as the lower electrode and in the test area on the substrate, a test common layer disposed in a same layer as the common layer and on the electrode patterns, where a plurality of openings is defined through the common layer to expose a part of each of the electrode patterns, and an electrode layer disposed in a same layer as the upper electrode, on the test common layer, and in contact with the electrode patterns through the openings.

In an embodiment, the test element group may further include a plurality of conductive patterns disposed in the test area on the substrate.

In an embodiment, the display device may further include a via layer disposed between the substrate and the electrode patterns. In such an embodiment, the electrode patterns may be electrically connected to the conductive patterns through contact holes defined in the via layer, respectively.

In an embodiment, the conductive patterns may be spaced apart from each other and the electrode patterns may be spaced apart from each other.

In an embodiment, the test area may surround at least a part of the display area.

In an embodiment, the common layer may extend from the display area to the test area, and an extending part of the common layer in the test area may define the test common layer. In such an embodiment, the upper electrode may extend from the display area to the test area, and an extending part of the upper electrode in the test area may define the electrode layer.

In an embodiment, the lower electrode and the electrode patterns may include a same material as each other.

In an embodiment, each of the lower electrode and the electrode patterns may have a stacked structure including indium tin oxide ("ITO")/Ag/ITO.

In an embodiment, the upper electrode and the electrode layer may include a same material as each other.

In an embodiment, the test element group may further include a plurality of conductive patterns disposed in the test area on the substrate. In such an embodiment, the display device may further include a source electrode and a drain electrode disposed in a same layer as the conductive patterns in the display area on the substrate.

In an embodiment, the conductive patterns, the source electrode, and the drain electrode may include a same material as each other.

In an embodiment, a part of an electrode pattern, which is located at a first end of the test element group, among the electrode patterns may define a first test pad of the test element group. In such an embodiment, a part of an electrode pattern, which is located at a second end of the test element group, among the electrode patterns may define a second test pad of the test element group.

In an embodiment, when viewed in a plan view, the test element group has a tetragon shape where one side is opened.

According to an embodiment of the invention, a method for inspecting defect of the display device includes preparing a substrate including a display area and a test area adjacent to the display area, providing a lower electrode in the display area on the substrate, providing a plurality of electrode patterns in the test area on the substrate, providing a common layer on the lower electrode, providing a test common layer on the electrode patterns, forming a plurality of openings exposing a part of each of the electrode patterns by removing a part of the test common layer, providing an upper electrode on the common layer, providing an electrode layer on the test common layer, and measuring a resistance of the openings.

In an embodiment, the method may further include providing a plurality of conductive patterns in the test area on the substrate.

In an embodiment, the conductive patterns, the electrode patterns, the test common layer, and the electrode layer may collectively define a test element group.

In an embodiment, the measuring the resistance may include measuring the resistance of the openings by connecting a resistance measuring device to a part of the conductive patterns located at an end of the test element group among the conductive patterns.

In an embodiment, the openings may be formed through a laser drilling process.

In an embodiment, the electrode patterns and the lower electrode may be simultaneously formed with each other. In such an embodiment, the test common layer and the common layer may be simultaneously formed with each other, and the electrode layer and the upper electrode may be simultaneously formed with each other.

In an embodiment, the electrode layer may be in contact with the electrode patterns through the openings.

In embodiments of the invention, a display device may include openings formed through a common electrode by laser drilling and a test element group disposed in the test area. Accordingly, defect of the display device may be accurately inspected through the test element group.

In embodiments of a method for inspecting defect of the display device according to the invention, resistance of the openings may be measured through the test element group disposed in the test area of the display device. Accordingly, defect of the display device may be inspected early, and process cost may be reduced.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
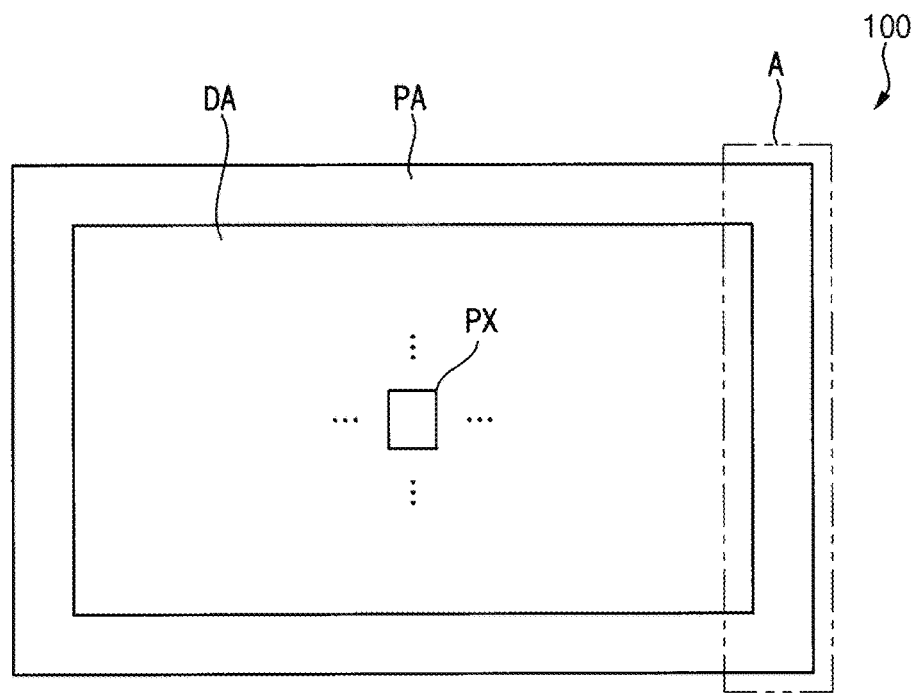
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
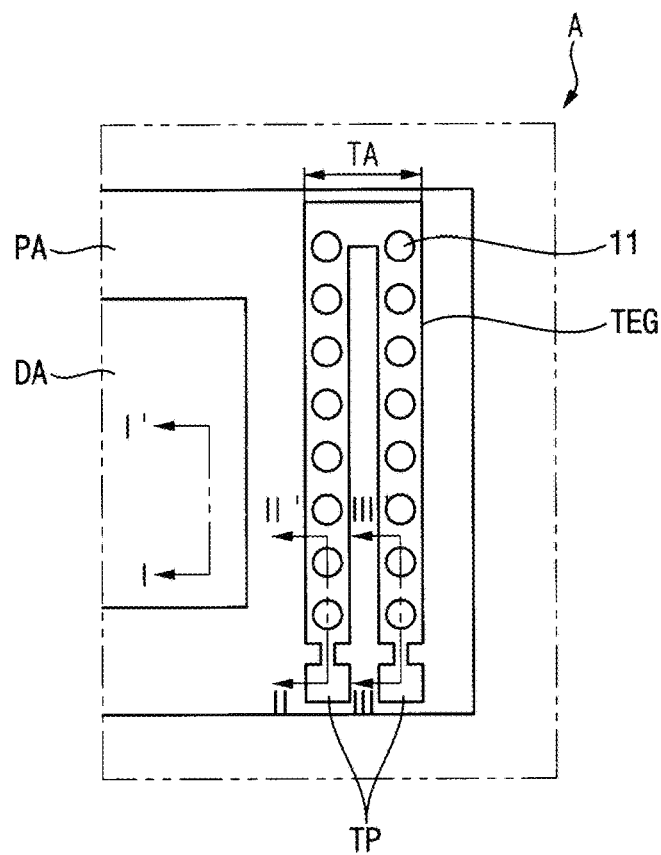
FIG. 2 is an enlarged plan view illustrating an area "A" of FIG. 1.

FIG. 1 is a plan view illustrating a display device according to an embodiment. FIG. 2 is an enlarged plan view illustrating an area "A" of FIG. 1.

FIGS. 1 and 2, an embodiment of the display device 100 may include a display area DA and a peripheral area PA adjacent to the display area DA.

A plurality of pixels PX for displaying an image may be disposed in the display area DA. The peripheral area PA may mean an area in which an image is not displayed.

In an embodiment, the test area TA may be defined or positioned inside the peripheral area PA. The test area TA may surround at least a part of the display area DA.

In an embodiment, a test element group TEG may be disposed in the test area TA. On a plan view, the test element group TEG may have a rotated U-like shape. In one embodiment, for example, when viewed in a plan view, the test element group TEG may have a tetragon shape where one side is opened. However, the configuration of the invention is not limited thereto, and the test element group TEG may have a different shape when viewed in a plan view. Herein, the phrase "when viewed in a plan view" may means when viewed from a top plan view or a plan view in a thickness direction of the display device 100.

In an embodiment, a plurality of openings 11 may be defined or located in the test element group TEG. In such an embodiment, as will be described later, a part of the test element group TEG may define a test pad portion TP to which the resistance measuring device 300 is connected (see FIGS. 12 and 13). In such an embodiment, a defect of the display device 100 may be inspected by measuring the resistance of the openings 11 through the test pad portion TP.

In general, in a case where a large organic light emitting device has a top emission structure, resistance of an upper electrode, which is a cathode electrode, may be high. In such a case, a metal line, which is an auxiliary line, may be formed to reduce the resistance of the upper electrode. In this case, an opening forming process using a laser drilling process, or the like, may be additionally performed to electrically connect the auxiliary line and the cathode electrode.

In a conventional display device, defects of the display device are inspected by observing the openings formed through the laser drilling process in a display area with a microscope photograph. If an output of a laser drilling is insufficient, there may be a part in which the opening is formed and a part in which the opening is not formed in processing portions to which the laser drilling process is to be reflected. In this case, a phenomenon in which current flows in the part where the opening is formed, and a dark portion is generated in the part where the opening is not formed, resulting in a defect in the display device.

In an embodiment of the display device 100 according to the invention, the test element group TEG on which the laser drilling process is performed may be defined or disposed in the test area TA. Accordingly, defects of the display device 100 may be inspected by measuring resistance of the openings 11 of the test element group TEG.

Figure 3:
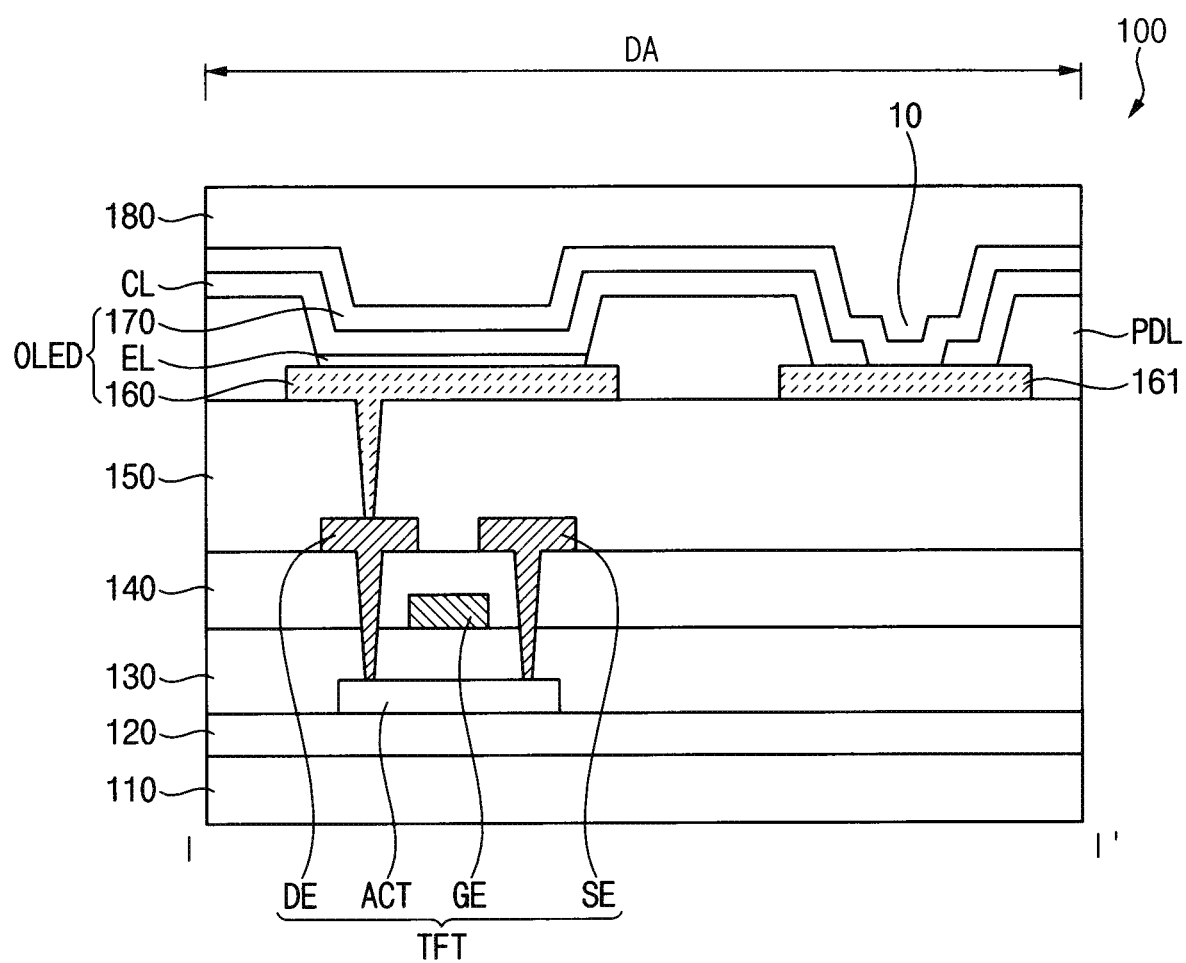
FIG. 3 is a cross-sectional view taken along line I-I' of FIG. 2.

FIG. 3 is a cross-sectional view taken along the line of FIG. 2.

Referring to FIG. 3, an embodiment of the display device 100 may include a substrate 110, a buffer layer 120, a gate insulating layer 130, an interlayer insulating layer 140, a thin film transistor TFT, a common layer CL, an organic light emitting element OLED, a pixel defining layer PDL, a thin film encapsulation layer 180, a metal line 161, and the like. The thin film transistor TFT may include an active layer ACT, a gate electrode GE, a source electrode SE, and a drain electrode DE, and the organic light emitting element OLED may include a lower electrode 160, a light emitting layer EL and an upper electrode 170.

Figure 4:
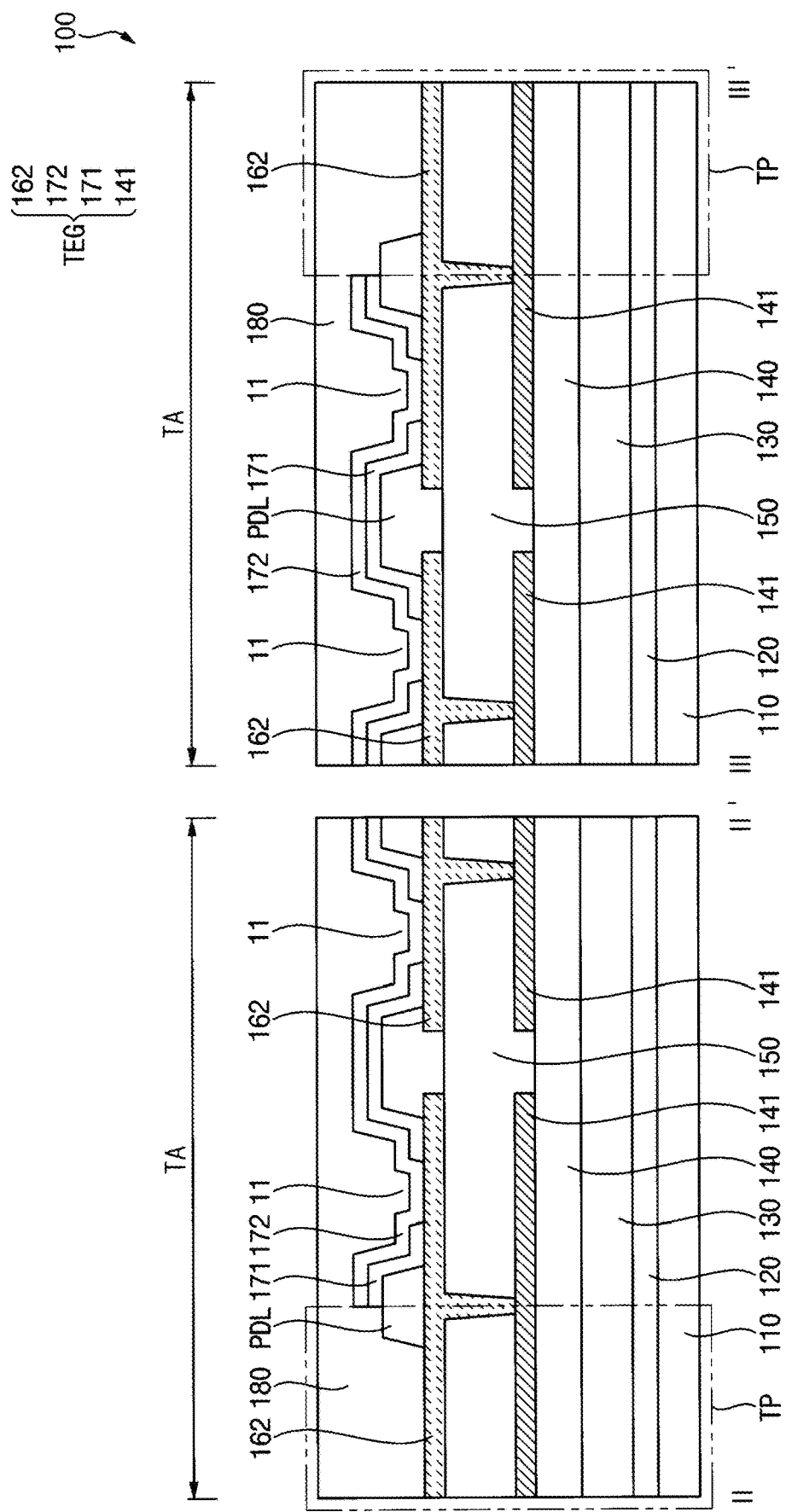
FIG. 4 is a cross-sectional view taken along lines II-II' and III-III' of FIG. 2.

The substrate 110 may include a display area DA, a peripheral area PA adjacent to the display area DA, and a test area TA positioned inside the peripheral area PA (FIGS. 2, 3, and 4). In such an embodiment, the display area DA, the peripheral area PA and the test area TA may be defined on the substrate 110. The substrate 110 may include a transparent or opaque material. In one embodiment, for example, the substrate 110 may include at least one selected from a quartz substrate, a synthetic quartz substrate, a calcium fluoride substrate, a soda lime glass substrate, an alkali-free glass substrate, and the like.

The buffer layer 120 may be disposed on the substrate 110. The buffer layer 120 may be entirely disposed in the display area DA, the peripheral area PA, and the test area TA (see FIGS. 2, 3, and 4). The buffer layer 120 may prevent diffusion of metal atoms or impurities from the substrate 110 to the thin film transistor TFT. In one embodiment, for example, the buffer layer 120 may include an inorganic material such as oxide or nitride.

The active layer ACT may be disposed in the display area DA on the buffer layer 120. The active layer ACT may include a channel region, a source region, and a drain region. The source region and the drain region may be positioned on opposing sides of the channel region. Impurities may be doped in the source region and the drain region.

The active layer ACT may include a silicon semiconductor layer or an oxide semiconductor layer. In one embodiment, for example, the active layer ACT may include polysilicon or the like. Alternatively, the active layer ACT may include at least one selected from indium (In), zinc (Zn), gallium (Ga), tin (Sn), titanium (Ti), aluminum (Al), hafnium (Hf), zirconium (Zr), and magnesium. (Mg) and a combination thereof.

The gate insulating layer 130 may be disposed on the buffer layer 120. The gate insulating layer 130 may be entirely disposed in the display area DA, the peripheral area PA, and the test area TA (see FIGS. 2, 3, and 4). The gate insulating layer 130 may sufficiently cover the active layer ACT. In one embodiment, for example, the gate insulating layer 130 may include at least one selected from silicon oxide (SiOx), silicon nitride (SiNx), silicon oxynitride (SiOxNy), silicon carbide (SiCx), and the like.

The gate electrode GE may be disposed in the display area DA on the gate insulating layer 130. The gate electrode GE may overlap the channel region of the active layer ACT. In one embodiment, for example, the gate electrode GE may include at least one selected from a metal, an alloy, a metal nitride, a conductive metal oxide, a transparent conductive material, and a combination thereof.

The interlayer insulating layer 140 may be disposed on the gate insulating layer 130. The interlayer insulating layer 140 may be entirely disposed in the display area DA, the peripheral area PA, and the test area TA (see FIGS. 2, 3, and 4). The interlayer insulating layer 140 may sufficiently cover the gate electrode GE. In one embodiment, for example, the interlayer insulating layer 140 may include at least one selected from silicon oxide, silicon nitride, silicon oxynitride, silicon carbide, and the like.

The source electrode SE and the drain electrode DE may be disposed in the display area DA on the interlayer insulating layer 140. The source electrode SE and the drain electrode DE may be respectively connected in the source region and the drain region of the active layer ACT through a contact hole defined in, e.g., formed by removing a part of, the gate insulating layer 130 and the interlayer insulating layer 140. Each of the source electrode SE and the drain electrode DE may include at least one selected from a metal, an alloy, a metal nitride, a conductive metal oxide, a transparent conductive material, and a combination thereof. In one embodiment, for example, the thin film transistor TFT may receive a first power voltage through the source electrode SE.

The via layer 150 may be disposed on the interlayer insulating layer 140. The via layer 150 may be entirely disposed in the display area DA, the peripheral area PA, and the test area TA (see FIGS. 2, 3, and 4). The via layer 150 may sufficiently cover the source electrode SE and the drain electrode DE. The via layer 150 may include an organic insulating material. In one embodiment, for example, the via layer 150 includes at least one selected from a phenolic resin, an acrylic resin, a polyimide resin, a polyamide resin, a siloxane resin, an epoxy resin, an epoxy resin, and the like.

The lower electrode 160 may be disposed in the display area DA on the via layer 150. The lower electrode 160 may be connected to the drain electrode DE through a contact hole defined in, e.g., formed by removing a part of, the via layer 150. In one embodiment, for example, the lower electrode 160 may include at least one selected from a metal, an alloy, a metal nitride, a conductive metal oxide, a transparent conductive material, and a combination thereof. In an embodiment, the lower electrode 160 may have a stacked structure or a triple layered structure including indium tin oxide ("ITO")/silver (Ag)/ITO.

In an embodiment, the metal line 161 may be disposed in the display area DA on the via layer 150. The metal line 161 may be disposed between the plurality of pixels PX shown in FIG. 1. The metal line 161 may be provided in plural. In one embodiment, for example, when viewed in a plan view, the metal line 161 may be entirely arranged in a mesh structure in the display area DA. In one embodiment, for example, when viewed in a plan view, the metal line 161 may include a plurality of first metal lines disposed in a horizontal direction and a plurality of second metal lines disposed in a vertical direction. In one embodiment, for example, the metal line 161 may function as a line that transmits a second power voltage. In such an embodiment, the second power voltage may be applied to the upper electrode 170 through the metal line 161.

In an embodiment, the lower electrode 160 and the metal line 161 may include a same material as each other. In such an embodiment, the lower electrode 160 and the metal line 161 may be disposed in or directly on a same layer using a same material. In an embodiment, the lower electrode 160 and the metal line 161 may have a stacked structure including ITO/Ag/ITO.

The pixel defining layer PDL may be disposed in the display area DA on the via layer 150. An opening may be defined through the pixel defining layer PDL to expose at least a part of the lower electrode 160. An emission area and a non-emission area of the display device 100 may be defined by the opening of the pixel defining layer PDL. In one embodiment, for example, a part in which the opening of the pixel definition layer PDL is located may correspond to the emission area, and the non-emission area may correspond to a part adjacent to the opening of the pixel definition layer PDL. In one embodiment, for example, the pixel defining layer PDL may include an organic insulating material.

The light emitting layer EL may be disposed on the lower electrode 160. The light emitting layer EL may be formed using at least one of light emitting materials capable of emitting red light, green light, and blue light. In an embodiment, the light emitting layer EL may be formed using a light emitting material capable of emitting the blue light. In one embodiment, for example, the light emitting layer EL may include a low molecular weight organic compound or a high molecular weight organic compound.

The common layer CL may be disposed in the display area DA on the lower electrode 160 and the metal line 161. The common layer CL may be entirely disposed in the display area DA. The common layer CL may include at least one selected from a hole injection layer, a hole transport layer, an electron transport layer, an electron injection layer, and the like. In an embodiment, although not shown in detail in FIG. 3, the light emitting layer EL may be disposed between the hole transport layer and the electron transport layer.

In an embodiment, an opening 10 may be defined through the common layer CL to expose at least a part of the metal line 161. In such an embodiment, a part of the common layer CL overlapping the metal line 161 may be removed by a laser drilling to form the opening 10. The opening 10 may be formed in plural in the display area DA as shown in FIG. 1. In such an embodiment, the opening 10 may be formed in plural between the plurality of pixels PX as shown in FIG. 1.

The upper electrode 170 may be disposed on the common layer CL. The upper electrode 170 may be entirely disposed in the display area DA. In one embodiment, for example, the upper electrode 170 may include at least one selected from a metal, an alloy, a metal nitride, a conductive metal oxide, a transparent conductive material, and a combination thereof. In an embodiment, the upper electrode 170 may have a stacked structure including Mg and Ag.

In an embodiment, the upper electrode 170 may be in contact with the metal line 161 through the opening 10. In such an embodiment, the upper electrode 170 may be electrically connected to the metal line 161 through the opening 10.

The thin film encapsulation layer 180 may be disposed on the upper electrode 170. The thin film encapsulation layer 180 may be entirely disposed in the display area DA, the peripheral area PA, and the test area TA (see FIGS. 2, 3, and 4). The thin film encapsulation layer 180 may have a stacked structure of an inorganic layer and an organic layer. In one embodiment, for example, the organic layer may include a cured polymer such as polyacrylate ("PAR"). In one embodiment, for example, the inorganic layer may include at least one selected from silicon oxide, silicon nitride, silicon carbide, aluminum oxide (AlOx), tantalum oxide (TaOx), hafnium oxide (HfOx), zirconium oxide (ZrOx), titanium oxide (TiOx), and the like.

Referring to FIGS. 3 and 4, an embodiment of the display device 100 may include the substrate 110, the buffer layer 120, the gate insulating layer 130, the interlayer insulating layer 140, the thin film transistor TFT, the via layer 150, the pixel defining layer PDL, the organic light emitting element OLED, the common layer CL, the metal line 161, the thin film encapsulation layer 180, the test element group TEG, and the like. The test element group TEG may include conductive patterns 141, electrode patterns 162, a test common layer 171, and an electrode layer 172. In such an embodiment, elements of the display device 100 shown in FIG. 4 may be substantially the same as those of the display device 100 described above with reference to FIG. 3 except for the test element group TEG. Hereinafter, the test element group TEG will be mainly described.

In an embodiment, the plurality of conductive patterns 141 may be disposed in the test area TA on the interlayer insulating layer 140. The conductive patterns 141 may be spaced apart from each other. The conductive patterns 141 may include a same material as the source electrode SE and the drain electrode DE shown in FIG. 3. In such an embodiment, the conductive patterns 141 may be disposed in or directly on a same layer using a same material as the source electrode SE and the drain electrode DE. In one embodiment, for example, each of the conductive patterns 141, the source electrode SE, and the drain electrode DE may include at least one selected from a metal, an alloy, a metal nitride, a conductive metal oxide, a transparent conductive material, and a combination thereof.

The via layer 150 may be disposed on the interlayer insulating layer 140. The via layer 150 may sufficiently cover the conductive patterns 141. The plurality of electrode patterns 162 may be disposed in the test area TA on the via layer 150. The electrode patterns 162 may be spaced apart from each other. The electrode patterns 162 may include a same material as the lower electrode 160 shown in FIG. 3. In such an embodiment, the electrode patterns 162 may be disposed in or directly on a same layer using a same material as the lower electrode 160. Each of the electrode patterns 162 may be electrically connected to the conductive patterns 141 through contact holes defined in, e.g., formed by removing a part of, the via layer 150.

In an embodiment, a part of an electrode pattern 162, which is located at an end of the test element group TEG, among the electrode patterns 162 and a part of a conductive pattern 141, which is located at the end of the test element group TEG, among the conductive patterns 141 may define a test pad portion TP of the test element group TEG.

In one embodiment, for example, a part of an electrode pattern 162 located at a first end of the test element group TEG among the electrode patterns 162 and a part of a conductive pattern 141 located at the first end of the test element group TEG among the conductive patterns 141 may define a first test pad portion of the test element group TEG. A part of an electrode pattern 162 located at a second end of the test element group TEG among the electrode patterns 162 and a part of a conductive pattern located at the second end of the test element group TEG among the conductive patterns may define a second test pad portion of the test element group TEG (see FIGS. 2 and 4).

The pixel defining layer PDL may be disposed in the test area TA on the via layer 150. The test common layer 171 may be disposed on the pixel defining layer PDL and the electrode patterns 162. The test common layer 171 may be entirely disposed in the test area TA except for the test pad portion TP. The test common layer 171 may include a same material as the common layer CL shown in FIG. 3. In such an embodiment, the test common layer 171 may be disposed in or directly on a same layer using a same material as the common layer CL. Alternatively, the common layer CL may be extended from the display area DA to the test area TA, and an extending part of the common layer CL located in the test area TA may define the test common layer 171.

In an embodiment, a plurality of openings 11 may be defined through the test common layer 171 to expose a part of each of the electrode patterns 162. In such an embodiment, the openings 11 may be formed by removing a part of the test common layer 171 by the laser drilling.

In an embodiment, the openings 10 of the display area DA and the openings 11 of the test area TA may be simultaneously formed with each other. In such an embodiment, the laser drilling process may be simultaneously performed on the display area DA and the test area TA (see FIGS. 3 and 4).

The electrode layer 172 may be disposed on the test common layer 171 and the pixel defining layer PDL. The electrode layer 172 may be entirely disposed in the test area TA except for the test pad portion TP. The electrode layer 172 may include a same material as the upper electrode 170 shown in FIG. 3. In such an embodiment, the electrode layer 172 may be disposed in or directly on a same layer using a same material as the upper electrode 170. Alternatively, the upper electrode 170 may extend from the display area DA to the test area TA, and an extending part of the upper electrode 170 located in the test area TA may define the electrode layer 172.

In an embodiment, the electrode layer 172 may be in contact with the electrode patterns 162 through the openings 11. In such an embodiment, the electrode layer 172 may be electrically connected to the electrode pattern 162 through the openings 11.

Figure 5:
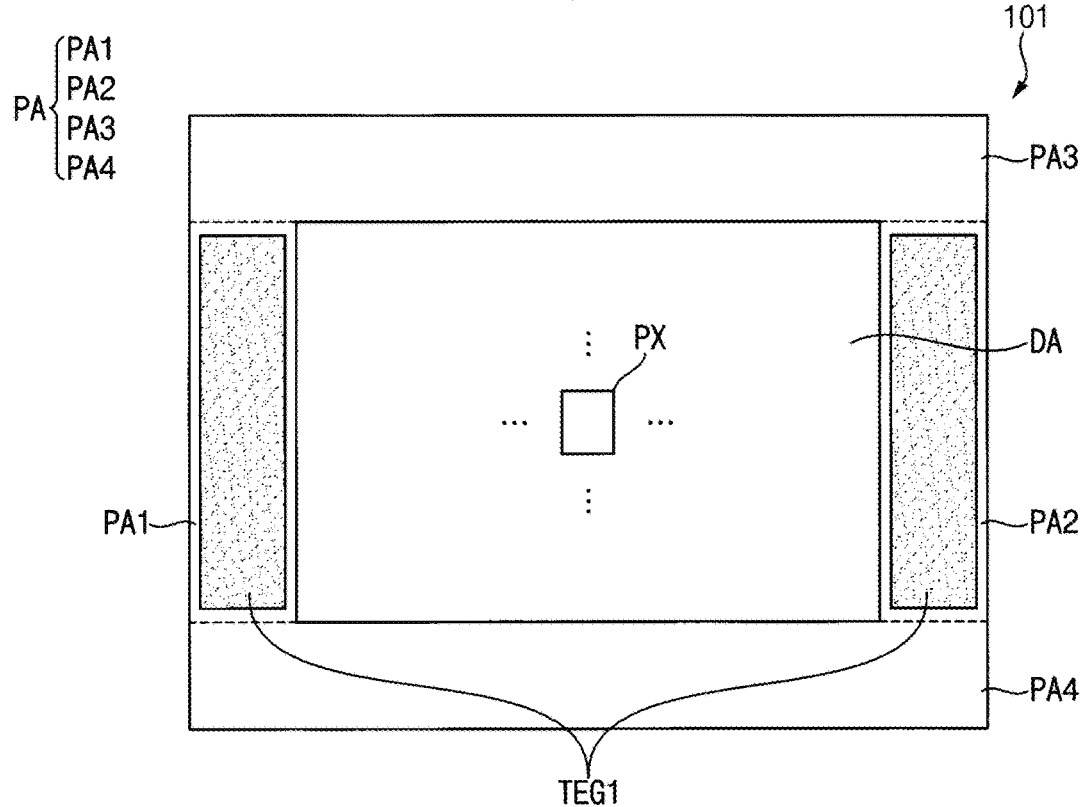
FIG. 5 is a plan view illustrating a test element group of a display device according to an embodiment.
Figure 6:
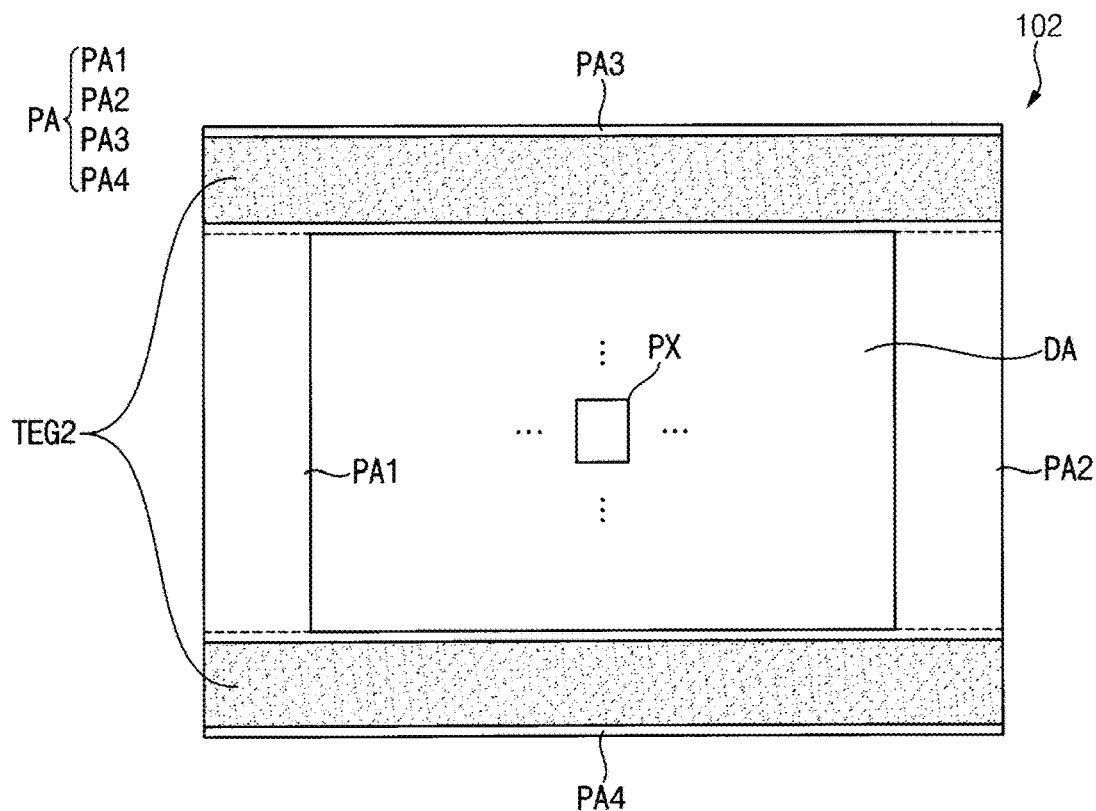
FIG. 6 is a plan view illustrating a test element group of a display device according to an alternative embodiment.
Figure 7:
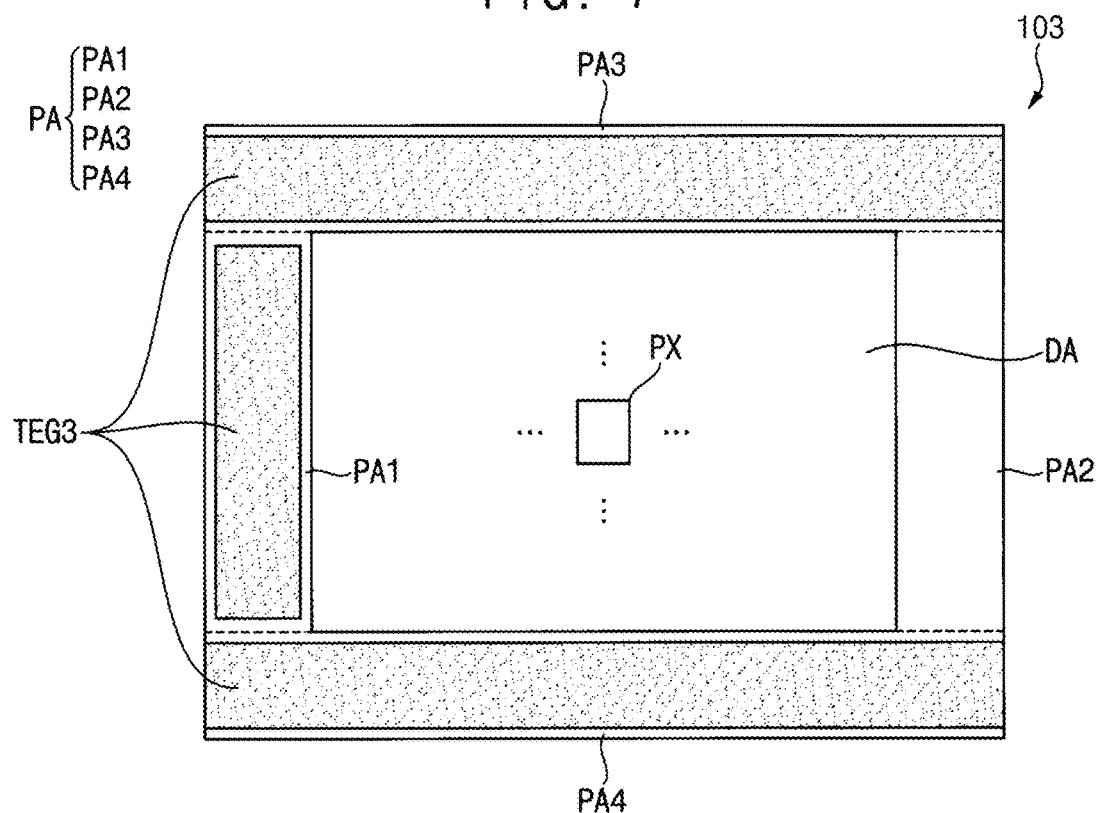
FIG. 7 is a plan view illustrating a test element group of a display device according to another alternative embodiment.
Figure 8:
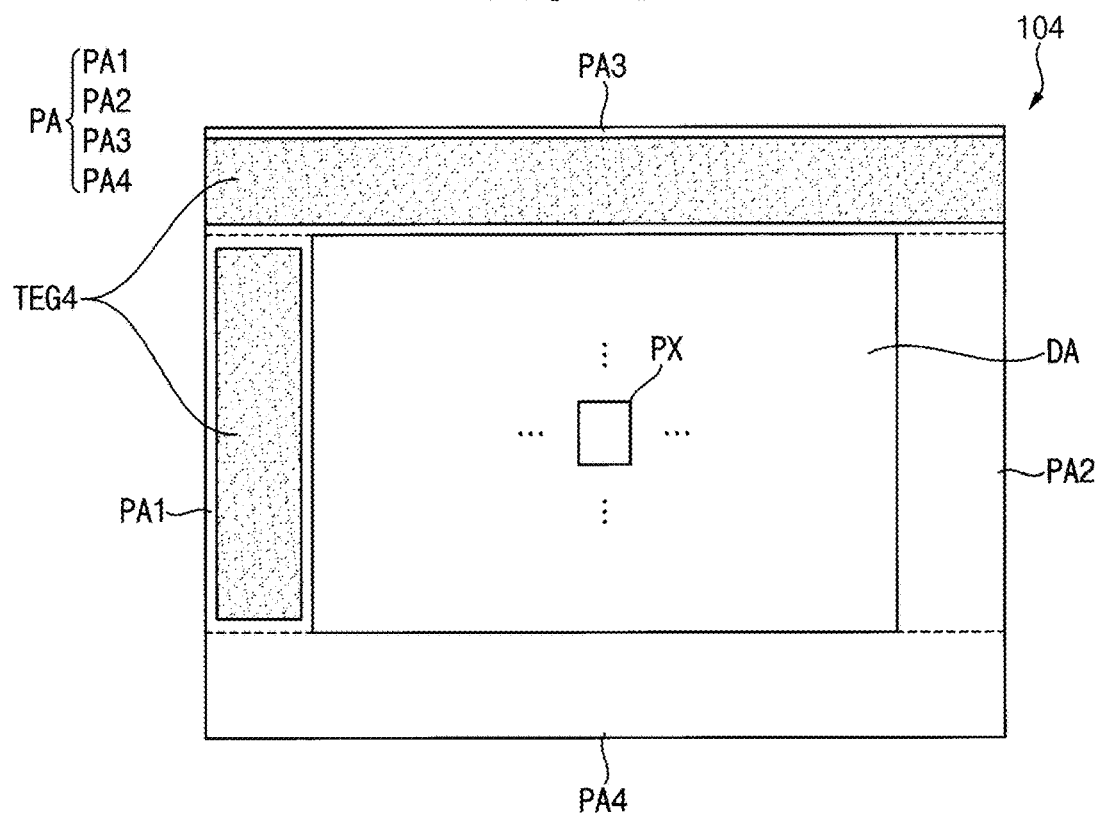
FIG. 8 is a plan view illustrating a test element group of a display device according to another alternative embodiment.

FIG. 5 is a plan view illustrating a test element group of a display device according to an embodiment. FIG. 6 is a plan view illustrating a test element group of a display device according to an alternative embodiment. FIG. 7 is a plan view illustrating a test element group of a display device according to another alternative embodiment. FIG. 8 is a plan view illustrating a test element group of a display device according to another alternative embodiment.

In FIGS. 5, 6, 7, and 8, an embodiment of the display devices 101, 102, 103, and 104 may include the display area DA and a peripheral area PA adjacent to the display area DA. The peripheral area DA may be divided into a first peripheral area PA1, a second peripheral area PA2, a third peripheral area PA3, and a fourth peripheral area PA4. The first peripheral area PA1 may be positioned on a left side of the display area DA. The second peripheral area PA2 may be positioned in a direction opposite to the first peripheral area PA1 or on a right side of the display area DA. The area PA3 may be positioned above the display area DA. The fourth peripheral area PA4 may be positioned in a direction opposite to the third peripheral area PA3 or below the display area DA.

Referring to FIG. 5, in an embodiment of the display device 101, each of two test element groups TEG1 may be disposed in the first peripheral area PA1 and the second peripheral area PA2. In such an embodiment, the two test element groups TEG1 may be disposed in opposite directions to each other.

Referring to FIG. 6, in an alternative embodiment of the display device 102, each of two test element groups TEG2 may be disposed in the third peripheral area PA3 and the fourth peripheral area PA4. In such an embodiment, the two test element groups TEG2 may be disposed in opposite directions to each other.

Referring to FIG. 7, in another alternative embodiment, each of three test element groups TEG3 may be disposed in the first peripheral area PA1, the third peripheral area PA3, and the fourth peripheral area PA4. Alternatively, each of the three test element groups TEG3 may be disposed in the second peripheral area PA2, the third peripheral area PA3, and the fourth peripheral area PA4. In such an embodiment, on the plan view, the three test element groups TEG3 may be disposed in a rotated U-like shape. In one embodiment, for example, when viewed in a plan view, the three test element groups TEG3 may be arranged in a shape of a tetragon where one side is opened.

Referring to FIG. 8, in another alternative embodiment, each of two test element groups TEG4 may be disposed in the first peripheral area PA1 and the third peripheral area PA3. Alternatively, each of the two test element groups TEG4 may be disposed in the second peripheral area PA2 and the third peripheral area PA3. In such an embodiment, on the plan view, the two test element groups TEG4 may be disposed in a rotated L-like shape. In one embodiment, for example, the two test element groups TEG4 may be disposed in a shape in which two straight bars are connected in a vertical direction.

Although not shown in detail in FIGS. 5, 6, 7, and 8, each of the test element groups TEG1, TEG2, TEG3, and TEG4 may include or be formed of a plurality of bars having a rectangular shape.

FIGS. 9, 10, 11, 12, and 13 are cross-sectional views illustrating a defect inspection method of a display device according to an embodiment.

Figure 9:
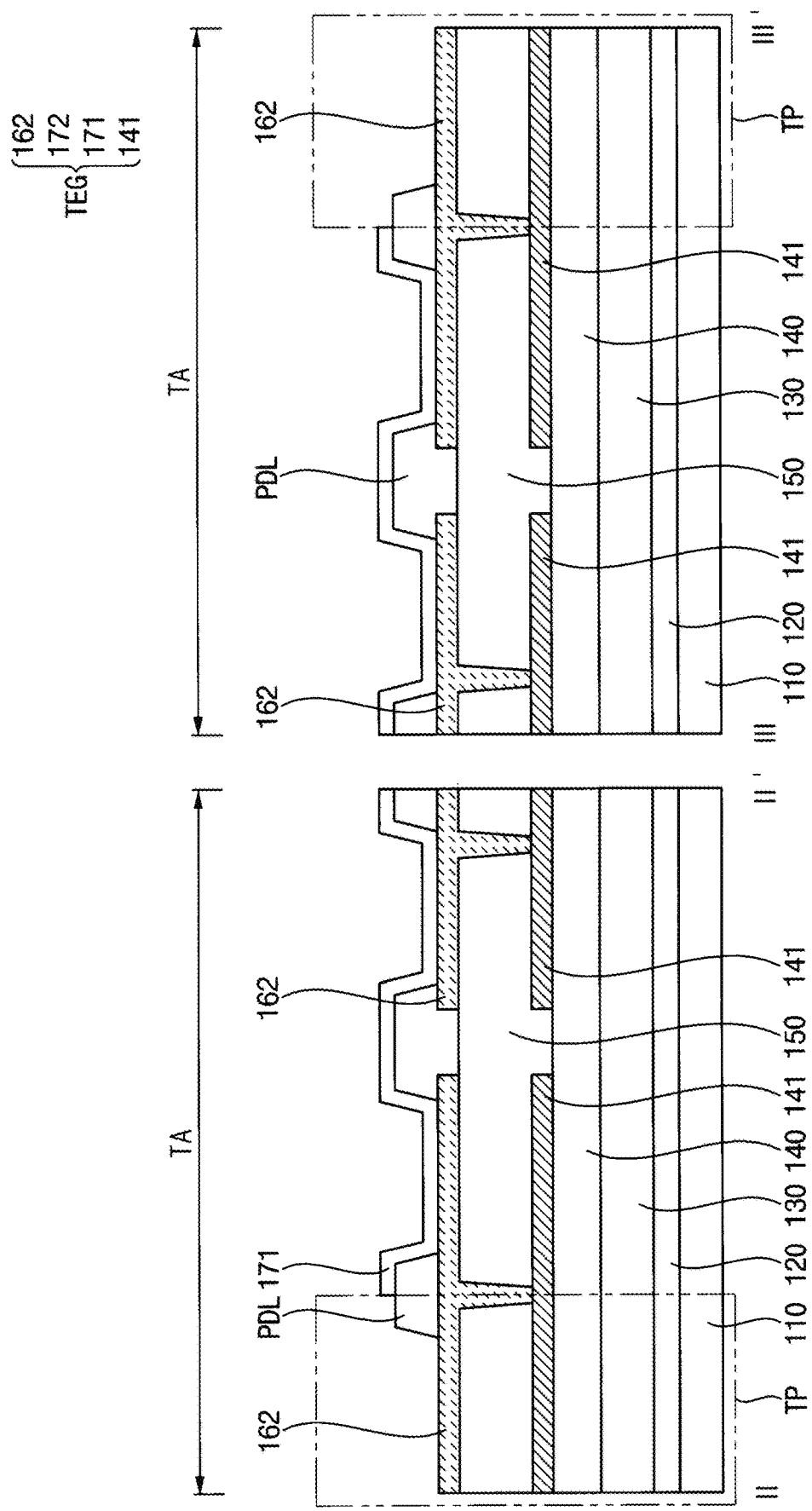
FIGS. 9, 10, 11, 12, and 13 are cross-sectional views illustrating a defect inspection method of a display device according to an embodiment.

Referring to FIGS. 2, 3, and 9, in an embodiment of a defect inspection method of a display device, the substrate including the display area DA, the peripheral area PA adjacent to the display area DA, and the test area TA positioned inside the peripheral area PA 110 may be provided or prepared. The substrate 110 may include a transparent material or an opaque material.

The buffer layer 120 may be provided or formed on the substrate 110. The buffer layer 120 may be entirely formed in the display area DA, the peripheral area PA, and the test area TA. In one embodiment, for example, the buffer layer 120 may include an inorganic material such as oxide or nitride.

The gate insulating layer 130 may be provided or formed on the buffer layer 120. The interlayer insulating layer 140 may be provided or formed on the gate insulating layer 130. The gate insulating layer 130 and the interlayer insulating layer 140 may be entirely formed in the display area DA, the peripheral area PA, and the test area TA. In one embodiment, for example, each of the gate insulating layer 130 and the interlayer insulating layer 140 may include at least one selected from silicon oxide, silicon nitride, silicon oxynitride, and the like.

The plurality of conductive patterns 141 may be formed in the test area TA on the interlayer insulating layer 140. The conductive patterns 141 may include a same material as the source electrode SE and the drain electrode DE shown in FIG. 3. In such an embodiment, the conductive patterns 141 may be simultaneously formed (or formed by a same process) using a same material as the source electrode SE and the drain electrode DE.

The via layer 150 may be provided or formed on the interlayer insulating layer 140. The via layer 150 may be entirely formed in the display area DA, the peripheral area PA, and the test area TA. The via layer 150 may sufficiently cover the source electrode SE, the drain electrode DE, and the conductive patterns 141. In one embodiment, for example, the via layer 150 may include an organic insulating material.

The plurality of electrode patterns 162 may be provided or formed in the test area TA on the via layer 150. The electrode patterns 162 may include a same material as the lower electrode 160 illustrated in FIG. 3. In such an embodiment, the electrode patterns 162 may be simultaneously formed using a same material as the lower electrode 160. Each of the electrode patterns 162 may be electrically connected to the conductive patterns 141 through contact holes formed by removing a part of the via layer 150.

The pixel defining layer PDL may be provided or formed on the via layer 150, the lower electrode 160, and the electrode patterns 162. In such an embodiment, the pixel defining layer PDL may be formed in the display area DA and the test area TA. In one embodiment, for example, the pixel defining layer PDL may include an organic insulating material.

The test common layer 171 may be provided or formed on the electrode patterns 162 and the pixel defining layer PDL. The test common layer 171 may be entirely formed in the test area TA except for the test pad portion TP. In such an embodiment, the test common layer 171 may not be formed in the test pad portion TP. The test common layer 171 may include a same material as the common layer CL shown in FIG. 3. In such an embodiment, the test common layer 171 may be simultaneously formed using a same material as the common layer CL. Alternatively, the test common layer 171 may be defined by a portion formed by extending a part of the common layer CL.

Figure 10:
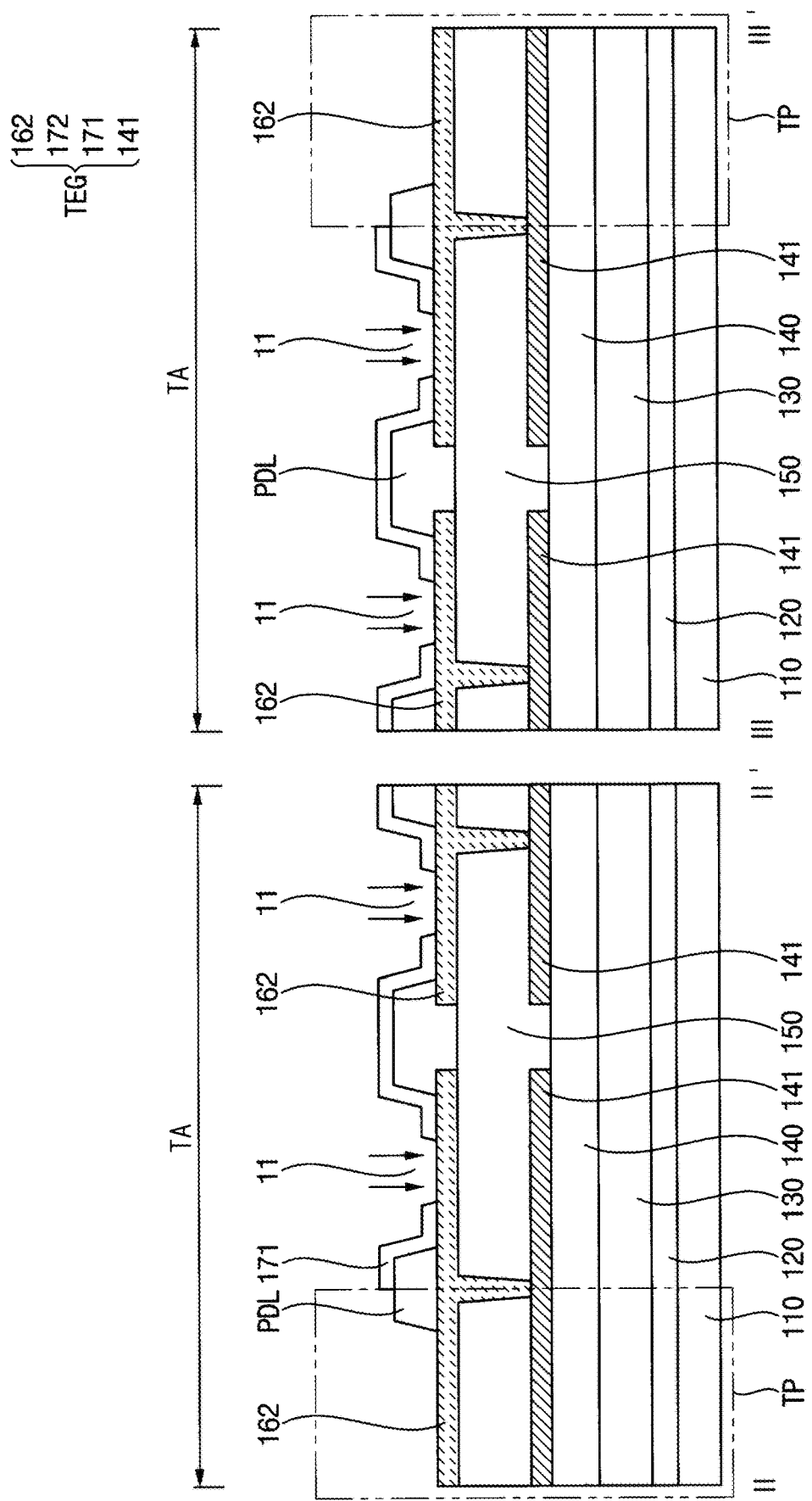

Referring to FIGS. 3 and 10, the plurality of openings 11 may be formed through the test common layer 171 to expose a part of each of the electrode patterns 162. In such an embodiment, the openings 11 may be formed by removing a part of the test common layer 171 by the laser drilling.

In an embodiment, the opening 10 of the display area DA (see FIG. 3) and the opening 11 of the test area TA may be simultaneously formed with each other. In such an embodiment, a part of the common layer CL in the display area DA may be removed by the laser drilling, to form an opening 10 exposing a part of the metal line 161. At the same time, a part of the test common layer 171 in the test area TA may be removed by the layer drilling, to form an opening 11 exposing a part of the electrode pattern 162.

Figure 11:
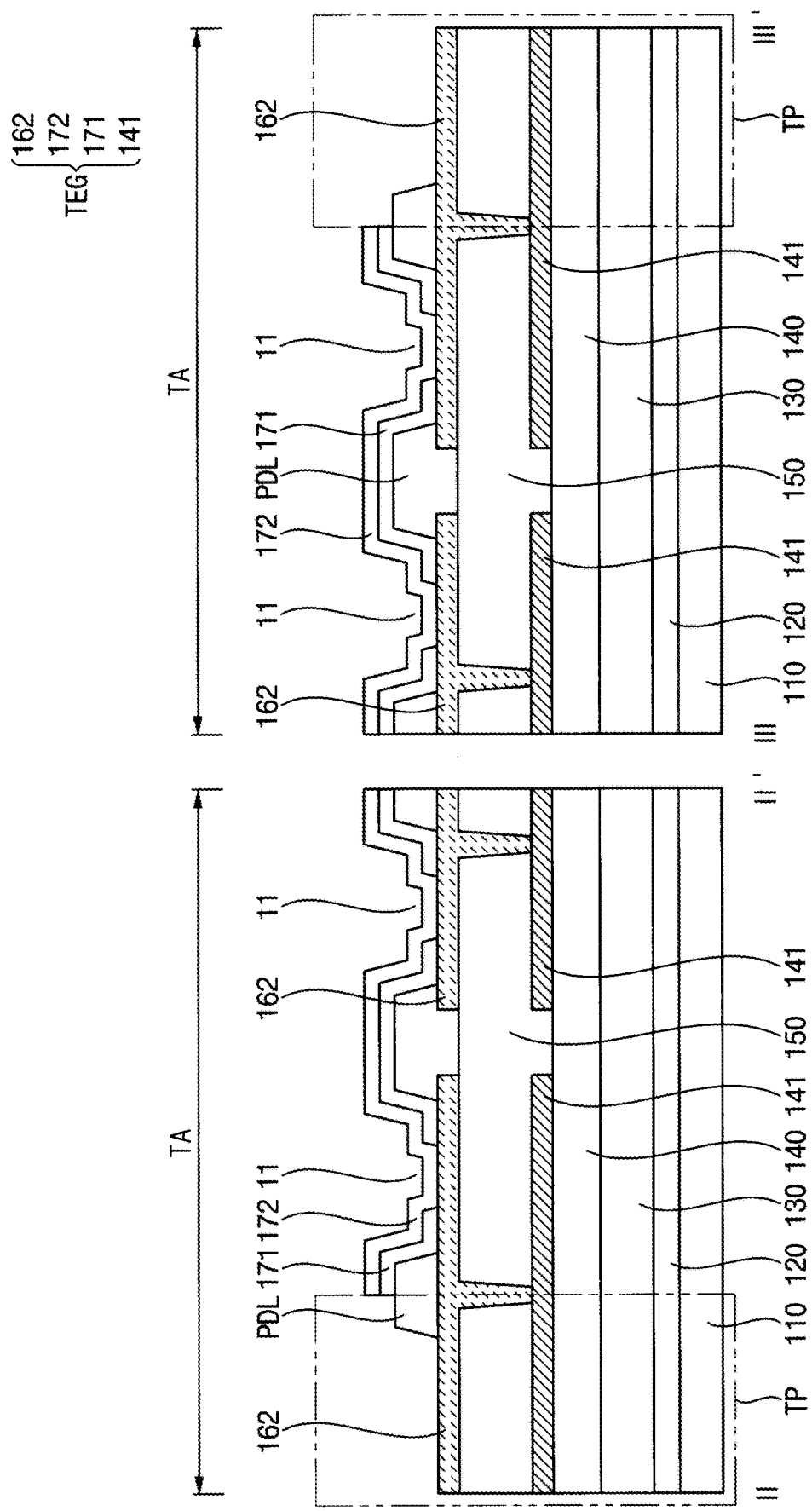

Referring to FIGS. 3 and 11, the electrode layer 172 may be provided or formed in the test area TA on the test common layer 171. The electrode layer 172 may be entirely formed in the test area TA except for the test pad portion TP. In such an embodiment, the electrode layer 172 may not be formed in the test pad portion TP. The electrode layer 172 may include a same material as the upper electrode 170. In such an embodiment, the electrode layer 172 may be simultaneously formed using a same material as the upper electrode 170. Alternatively, the electrode layer 172 may be defined by a portion formed by extending a part of the upper electrode 170.

In an embodiment, the electrode layer 172 may be in contact with the electrode patterns 162 through the openings 11. In such an embodiment, the electrode layer 172 may be electrically connected to the electrode patterns 162 through the openings 11, respectively.

Figure 12:
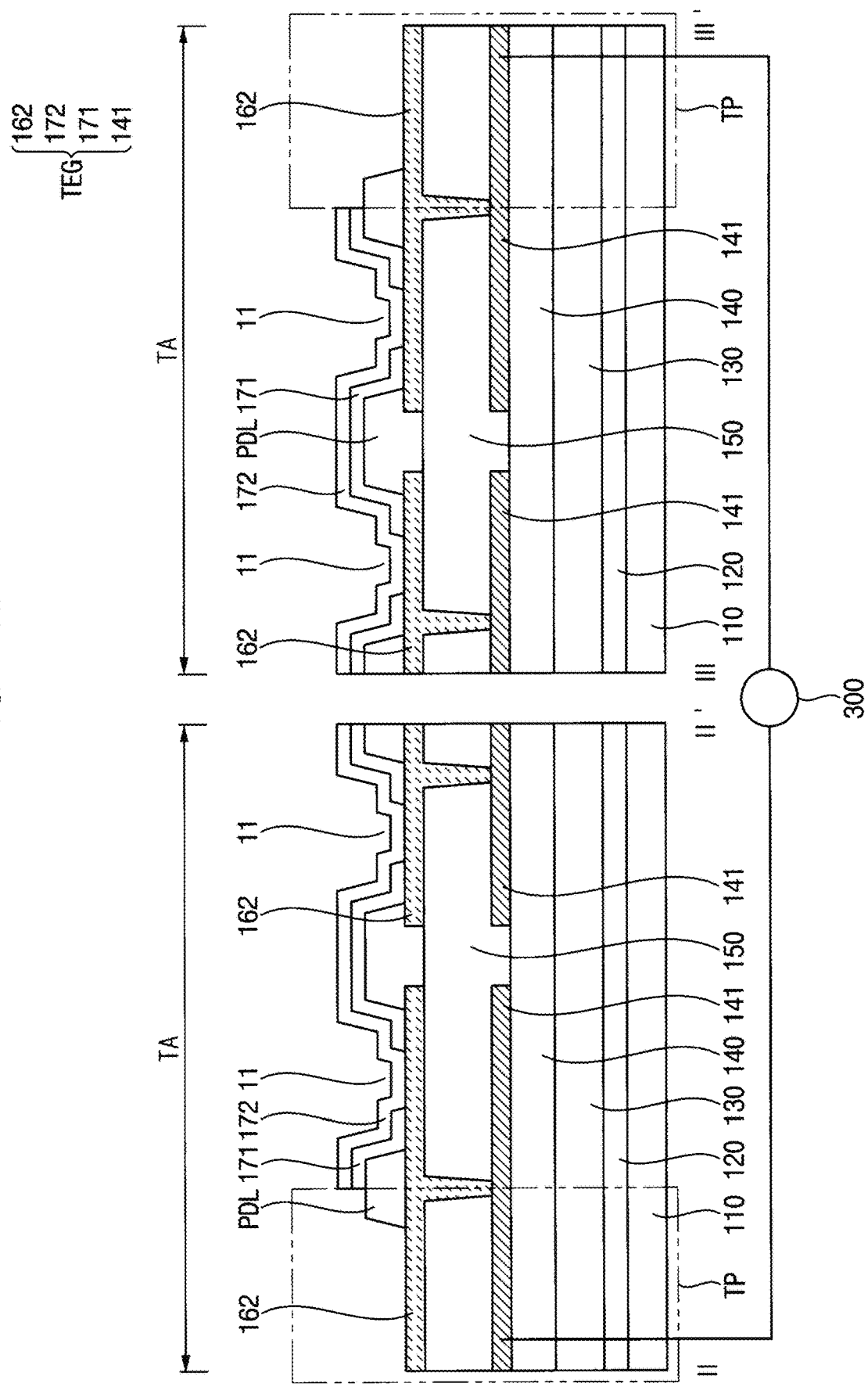
Figure 13:
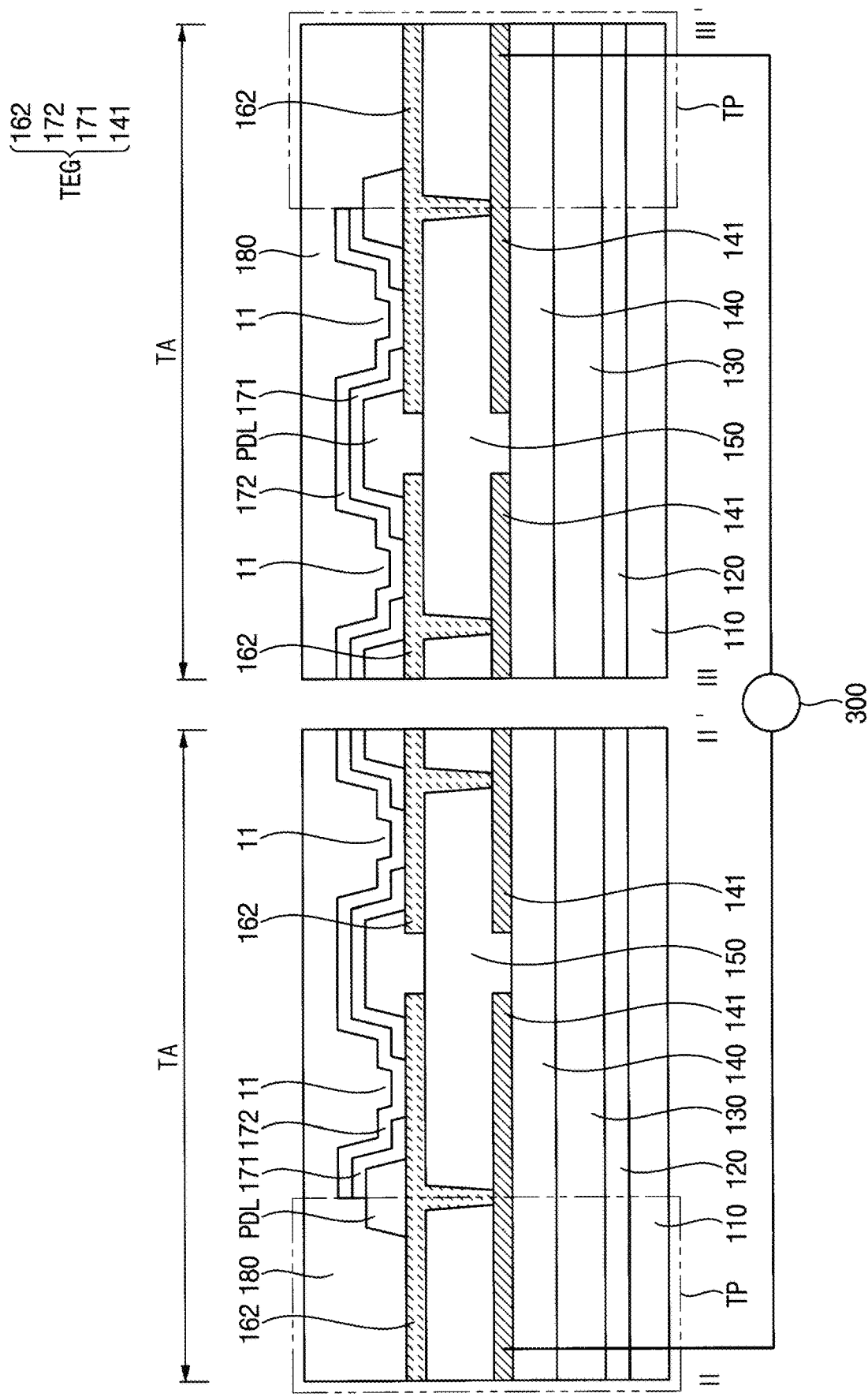

Referring to FIGS. 2, 4, and 12, in an embodiment, a resistance measuring device 300 may be connected to the test pad portions TP. In such an embodiment, the resistance measuring device 300 may be connected to a part of a conductive pattern 141 located at the end of the test element group TEG among the conductive patterns 141. Resistance of the openings 11 may be measured through the resistance measuring device 300. In one embodiment, for example, when a current is passed through the conductive patterns 141 of the test pads TP through the resistance measuring device 300, the current flows along the conductive patterns 141, the electrode patterns 162, and the electrode layer 172, and resistance of the openings 11 may be measured.

Referring to FIGS. 2, 3, 4, and 13, the thin film encapsulation layer 180 may be provided or formed on the electrode layer 172. The thin film encapsulation layer 180 may be entirely formed in the display area DA, the peripheral area PA, and the test area TA.

In an embodiment, after the thin film encapsulation layer 180 is provided or formed on the electrode layer 172, the resistance of the openings 11 may be measured by connecting the resistance measuring device 300 to the test pad portions TP.

In an embodiment, a part in the test area TA where the laser drilling process is to be performed may be defined as a processing portion. If an output of the laser drilling is insufficient and there is a part of the processing portion in which the opening 11 is not formed, the resistance of the part may be higher than that of a part where the opening 11 is formed. In such an embodiment, if a thickness of a lower layer of the electrode patterns 162 is changed, the output of the laser drilling may be insufficient. In this case, the display device 100 may be determined to be defective, and the display device 100 may be manufactured again. Alternatively, the laser drilling process may be performed again in a part of the processing portion in which the opening 11 is not formed.

Embodiments of the invention may be applied to various display devices including a display device, such as display devices for vehicles, ships and aircraft, portable communication devices, display devices for exhibition or information transfer, and medical display devices, for example.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a substrate including a display area and a test area adjacent to the display area;
    a lower electrode disposed in the display area on the substrate;
    a light emitting layer disposed on the lower electrode;
    a common layer disposed on the light emitting layer;
    an upper electrode disposed on the common layer; and
    a test element group including:
        a plurality of electrode patterns disposed in a same layer as the lower electrode and in the test area on the substrate;
        a test common layer disposed in a same layer as the common layer and on the plurality of electrode patterns, wherein a plurality of openings is defined through the test common layer to expose a part of each of the plurality of electrode patterns; and
        an electrode layer disposed in a same layer as the upper electrode, on the test common layer, and in contact with the plurality of electrode patterns through the plurality of openings.

2. The display device of claim 1, wherein the test element group further includes:
    a plurality of conductive patterns disposed in the test area on the substrate.

3. The display device of claim 2, further comprising:
    a via layer disposed between the substrate and the plurality of electrode patterns,
    wherein the plurality of electrode patterns are electrically connected to the plurality of conductive patterns through contact holes defined in the via layer, respectively.

4. The display device of claim 2, wherein
    the plurality of conductive patterns are spaced apart from each other, and
    the plurality of electrode patterns are spaced apart from each other.

5. The display device of claim 1, wherein the test area surrounds at least a part of the display area.

6. The display device of claim 1, wherein
    the common layer extends from the display area to the test area,
    an extending part of the common layer in the test area defines the test common layer,
    the upper electrode extends from the display area to the test area, and
    an extending part of the upper electrode in the test area defines the electrode layer.

7. The display device of claim 1, wherein the lower electrode and the plurality of electrode patterns include a same material as each other.

8. The display device of claim 1, wherein each of the lower electrode and the plurality of electrode patterns has a stacked structure including ITO/Ag/ITO.

9. The display device of claim 1, wherein the upper electrode and the electrode layer include a same material as each other.

10. The display device of claim 1, wherein the test element group further includes:
    a plurality of conductive patterns disposed in the test area on the substrate, and wherein the display device further comprises:
    source electrode and a drain electrode disposed in a same layer as the plurality of conductive patterns in the display area on the substrate.

11. The display device of claim 10, wherein the plurality of conductive patterns, the source electrode, and the drain electrode include a same material as each other.

12. The display device of claim 1, wherein
    a part of an electrode pattern, which is located at a first end of the test element group, among the plurality of electrode patterns defines a first test pad of the test element group, and
    a part of an electrode pattern, which is located at a second end of the test element group among the plurality of electrode patterns, defines a second test pad of the test element group.

13. The display device of claim 1, wherein when viewed in a plan view, the test element group has a tetragon shape where one side is opened.

* * * * *